United States Patent [19]
Webster et al.

[11] Patent Number: 5,390,364
[45] Date of Patent: Feb. 14, 1995

[54] LEAST-MEAN SQUARES ADAPTIVE DIGITAL FILTER HAVINGS VARIABLE SIZE LOOP BANDWIDTH

[75] Inventors: Mark A. Webster, Palm Bay; James C. Richards, Satellite Beach, both of Fla.

[73] Assignee: Harris Corporation, Melbourne, Fla.

[21] Appl. No.: 970,115

[22] Filed: Nov. 2, 1992

[51] Int. Cl.⁶ .................. H04B 15/00; H04B 1/10; H03H 7/30
[52] U.S. Cl. .................... 455/52.3; 455/307; 375/14; 364/724.2
[58] Field of Search ............... 455/10, 52.3, 63, 67.3, 455/65, 67.6, 296, 306, 307, 339; 375/11, 12, 13, 14, 99, 103; 333/28 R, 18, 203; 364/724.19, 724.2

[56] References Cited

U.S. PATENT DOCUMENTS

| | | | |
|---|---|---|---|
| 4,185,168 | 1/1980 | Graupe et al. | |
| 4,349,889 | 9/1982 | van den Elzen et al. | 364/724 |
| 4,672,665 | 6/1987 | Nagai et al. | 379/411 |
| 4,802,227 | 1/1989 | Elko et al. | 381/92 |
| 4,912,758 | 3/1990 | Arbel | 379/388 |
| 4,998,241 | 3/1991 | Brox et al. | 370/32.1 |
| 5,007,044 | 4/1991 | Miyoshi et al. | 370/32.1 |
| 5,036,857 | 8/1991 | Semmlow et al. | 128/715 |
| 5,146,470 | 9/1992 | Fujii et al. | 375/103 |
| 5,230,007 | 7/1993 | Baum | 375/14 |
| 5,267,266 | 11/1993 | Chen | 375/14 |

OTHER PUBLICATIONS

Stationary and Non Stationary Learning Characteristics of the LMS Adaptive Filter by Bernard Widrow et al., Proceedings of the IEEE; vol. 6-4, No. 8, Aug. 1976, pp. 1151-1142.
NonStationary Learning Characteristics of the LMS Algorithm by Gardner; Transactions on Circuits and Systems vol. C95-34, No. 10, Oct. 1987, pp. 1199-1207.
"A Variable Step (vs) Adaptive Filter Algorithm" by Richard W. Harris, et al., IEEE Transactions on Acoustics, Speech, and Signal Processing; vol. Assp. 34, No. 2, Apr. 1986, pp. 309-316.
Adaptive Algorithms with an Automatic Gain Control Feature by T. J. Shan et al., IEEE Transactions on Circuits and Systems, vol. 35, No. 1, Jan., 1988, pp. 122-127.
Comments on "Adaptive Algorithms with an Automatic Gain Control Feature" by Shlomo Karni et al. IEE Transactions on Circuits and Systems, vol. 37, No. 7, Jul. 1990, pp. 974-975.

Primary Examiner—Curtis Kuntz
Assistant Examiner—Lisa Charouel
Attorney, Agent, or Firm—Charles E. Wands

[57] ABSTRACT

An adaptive digital filter uses a weight adjustment unit for adjusting the weights of an adaptive digital filter according to one or more input signals to the digital filter and according to an error signal indicative of the difference between the actual and desired outputs of the digital filter. The weight adjustment unit has a first low-pass filter for low-pass filtering a signal indicative of the product of the error signal and the one or more input signals, a squarer for squaring the output of the first low-pass filter, a second low-pass filter for low-pass filtering the output of the squarer to extract the D.C. component thereof, a third low-pass filter for low-pass filtering a signal indicative of the output of the error signal squared to extract the D.C. component thereof, a dividing unit for dividing the output of the second low-pass filter by the output of the third low-pass filter to provide a loop bandwidth, and a weight calculation unit for providing values for one or more weights of the adaptive digital filter according to the previous values of the weights and the value of the loop bandwidth.

14 Claims, 6 Drawing Sheets

LEAST-MEAN SQUARES ADAPTIVE DIGITAL FILTER HAVINGS VARIABLE SIZE LOOP BANDWIDTH

FIELD OF THE INVENTION

This invention relates to the field of digital filtering and more particularly to the field of adaptive least means squares digital filtering.

BACKGROUND OF THE INVENTION

Digital filtering involves manipulating one or more digital input signals in order to provide one or more digital output signals. Digital signals are a series of digital values wherein each valve represents the magnitude of a particular signal, such as an electrical signal, at a particular time. In the case of electrical signals, a digital input signal can be produced by sampling the electrical signal periodically and converting each sampled value of the signal to a digital value. Similarly, a digital output signal can be converted to an analog electrical output signal by converting the series of digital values to analog values.

A digital filter can correspond to a known analog filter. For example, it is possible to construct a digital low-pass filter which operates in a manner equivalent to an analog low-pass filter having a resistor and a capacitor. The output signal of such a digital low-pass filter will be the input signal having high frequency components attenuated therefrom. An example of a digital low-pass filter can be represented by the following equation:

$$Y[n] = (Y[n-1] + X[n])/2$$

Y[n] represents a digital value indicative of the magnitude of the present value of the digital filter output. Y[n−1] represents a digital value indicative of the magnitude of the most recent digital filter output (i.e. the output of the digital filter for the previous iteration). X[n] represents a digital value indicative of the magnitude of the present input to the digital filter. For the low-pass digital filter represented by the above equation, the magnitude of the output equals one half of the sum of the magnitudes of the next most recent output and the input.

The flexibility of digital filters makes it possible in some instances to adjust the parameters of a filter during operation. For example, if a digital filter is implemented using computer software, then the equation that governs operation of the filter can be easily modified or replaced, thus changing characteristics of the filter. A digital filter which can be modified during operation is called an "adaptive digital filter". Adaptive digital filters are very useful in applications where the characteristics of the signal being filtered change over time.

A difficulty with adaptive digital filters is establishing criteria for modifying the filters. It is desirable to modify the filters in response to actual changes in the signal and to not modify the filters in response to spurious noise in the system. The modification mechanism needs to be relatively quick in order to respond adequately to actual signal changes. At the same time, the modification mechanism needs to be relatively slow in order to be resistant to spurious noise.

Techniques for theoretically determining the optimum rate at which an adaptive digital filter should be allowed to change are set forth in W. A. Gardner, "Nonstationary Learning Characteristics of the LMS Algorithm," IEEE Trans, on Circuits and Systems, Vol. CAS-34, No. 10, pp. 1199–1207, October 1987 and in B. Widrow, J. M. McCool, M. G. Larimore, C. R. Johnson, "Stationary and Nonstationary Learning Characteristics of the LMS Adaptive Filter," Proc. IEEE, Vol. 64, No. 8, pp. 1151–1162, August 1976. However, the Gardner and Widrow results are only theoretical because they require values of parameters which cannot be measured in real-world applications of adaptive digital filter.

There are also a variety of ad-hoc techniques for determining the optimum rate of change for an adaptive digital filter, such as that shown in U.S. Pat. No. 4,349,889 to van den Elzen et. al titled "NON-RECURSIVE FILTER HAVING ADJUSTABLE STEP-SIZE FOR EACH ITERATION". The majority of these ad hoc techniques adjust the rate according to a measure of the filter error (i.e. the difference between the actual output and the idealized output of the filter). However, this measurement does not distinguish between spurious noise, which should be ignored and hence should cause the rate of change of the adaptive filter to decrease, and an actual change in the signal being tracked, which should cause the rate of change of the adaptive filter to increase.

SUMMARY OF THE INVENTION

According to the present invention, a weight adjustment unit for adjusting the weights of an adaptive digital filter according to one or more input signals to the digital filter and according to an error signal indicative of the difference between the actual and desired outputs of the digital filter uses a first low-pass filter for low-pass filtering a signal indicative of the product of the error signal and the one or more input signals, a squarer, for squaring the output of the first low-pass filter, a second low-pass filter for low-pass filtering the output of the squarer to extract the D.C. component thereof, a third low-pass filter for low-pass filtering a signal indicative of the output of the error signal squared to extract the D.C. component thereof, a dividing unit for dividing the output of the second low-pass filter by the output of the third low-pass filter to provide a loop bandwidth signal, and a weight calculation unit for providing values for one or more weights of the adaptive digital filter according to the value of the loop bandwidth signal and according to the previous values of the weights.

In an exemplary embodiment of the invention, the low-pass filters are single-pole IIR filters. In still another embodiment, the squarer provides to the second low-pass filter the sum of the squares of the output of the first low-pass filter and a single loop bandwidth is provided. In still other embodiments, processing for each weight is performed separately so that different loop bandwidth values are provided for each weight. In other embodiments of the invention, the first low-pass filter is a Weiner filter and a value indicative of spurious noise is subtracted from the input to the second low-pass filter.

A feature of the present invention is the ability to change the weights of the adaptive digital filter relatively rapidly in response to changes in the signal being filtered while at the same time changing the weights of the adaptive digital filter relatively slowly in response to spurious noise. The use of IIR digital low-pass filters for some embodiments simplifies the design. Determining a single loop bandwidth simplifies calculations in cases where the possible values for the weight adjustment are symmetrical about a mean squared error axis. Similarly, determining a different loop bandwidth for each weight is advantageous in cases where the possible values for the weight adjustment are not symmetrical about a mean squared error axis. Using the Weiner filter and subtracting a value indicative of spurious noise from the input to the second filter can improve performance in some instances.

Other advantages and novel features of the present invention will become apparent from the following detailed description of the invention when considered in conjunction with the accompanying drawings.

DESCRIPTION OF THE PREFERRED EMBODIMENTS

Figure 1A:
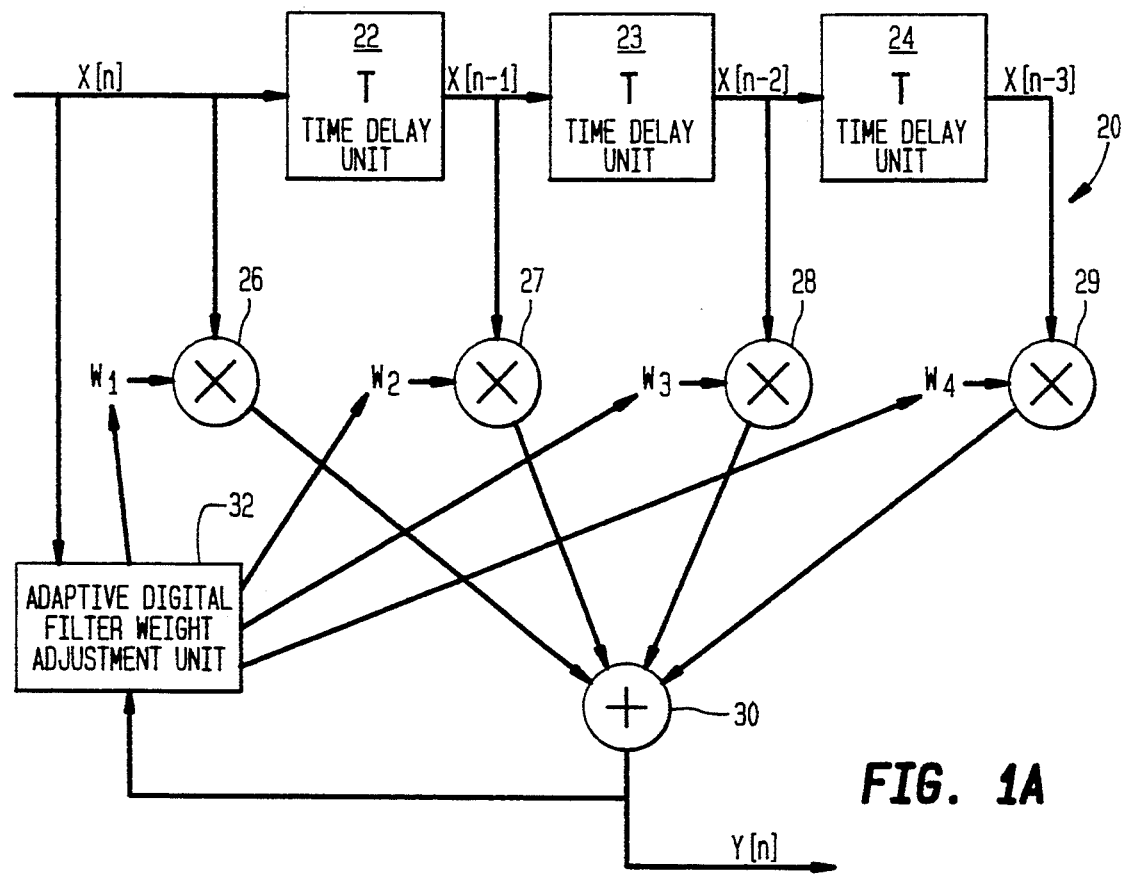
FIG. 1A is a schematic block diagram illustrative of an adaptive digital filter configured according to an exemplary embodiment of the present invention.

Referring to FIG. 1A, an adaptive digital filter 20 processes a digital version of an input signal X and provides a digital version of a signal Y as an output. The precise means by which the adaptive filter 20 is implemented (i.e. software, digital hardware, or a combination thereof) depends upon a variety of functional factors known to one skilled in the art which will become more apparent in light of the discussion which follows.

The magnitude of the present (i.e. most recently sampled) value of the signal X is a single digital quantity indicated as X[n]. The digital quantity X[n] is provided to a first time delay unit 22 which has a single digital output value indicated as X[n−1]. The quantity X[n−1] is the magnitude of a sampled value of the signal X sampled just prior to the X[n] sample. In other words, X[n] represents a single digital value indicative of the most recently sampled value of the signal X and X[n−1] represents a single digital value indicative of the next most recently sampled value of the signal X. The first time delay unit 22 therefore represents providing a time delay of one sample period.

The signal X[n−1] is provided to a second time delay unit 23 which provides an output X[n−2] which represents a single digital value indicative of a sampled value of the signal X sampled just prior to the X[n−1] sample. Similarly, the signal X[n−2] is provided to a third time delay unit 24 which has an output indicated as X[n−3] which represents a single digital value indicative of a sampled value of the signal X sampled just prior to the X[n−2] sample. The time delay units 22-24 each delay propagation of the digital sample values of the signal X by one sample period. Therefore, the time delay units 22-24 act as a shift register shifting therethrough digital values indicative of successive sampled values of the signal X. The quantities X[n], X[n−1], X[n−2], and X[n−3] represent the four most recently sampled values of the X signal.

The value X[n] is tapped and provided to a first weight multiplier 26. Similarly, the values X[n−1], X[n−2], and X[n−3] are tapped and provided to second, third, and fourth weight multipliers 27, 28, 29, respectively. The first weight multiplier 26 provides a digital output signal indicative of the magnitude of the X[n] quantity multiplied by a first weight W1. The second weight multiplier 27 provides an output signal indicative of the product of the quantity X[n−1] and a second weight, W2. The third weight multipliers 28 provides an output signal indicative of the product of X[n−2] and a third weight, W3. The fourth weight multiplier 29 provides an output signal indicative of the product of X[n−3] and a fourth weight, W4. The digital multiplications are performed by means known to one skilled in the art. The outputs of the weight multipliers 26-29 are provided to a summer 30, which adds the outputs of the weight multipliers 26-29 and provides the sum as a single digital output value, Y[n]. The value Y[n] is a present value of the signal Y that is output by the adaptive filter.

Operation of the adaptive filter 20 is as follows: For each sample period, a digital signal equal to the present sampled value of the signal X is provided to the first time delay unit 22. The time delay units 22-24 cause the X[n] signal from the previous iteration to become X[n−1], X[n−1] from the previous iteration to become X[n−2], and X[n−2] from the previous iteration to become X[n−3]. The quantities X[n], X[n−1], X[n−2], and X[n−3] are then multiplied by the weight multipliers 26-29, respectively. The outputs of the weight multipliers 26-29 are input to the summer 30 which provides the output signal Y[n]. At the next sample period, the process begins again and a new Y[n] is determined and then output. The quantity Y[n] can be expressed mathematically using the following equation:

$$Y[n] = W1*X[n] + W2*X[n-1] + W3*X[n-2] + W4*X[n-3] \quad (1)$$

It is worth noting that although the adaptive filter 20 is illustrated having the input X[n] shifted successively through the time delay units 22-24 once for each sample period, the invention described hereinafter can be practiced with an adaptive digital filter that is provided each iteration with a number of separate input signals rather than a single input signal delayed a number of times. In other words, it would be possible to provide the weight multipliers 26-29 with the present value of four separate input signals from four different sources, i.e. X1[n], X2[n], X3[n], and X4[n], instead of X[n], X[n−1], X[n−2], and X[n−3]. Therefore, the discussion which follows is applicable to either a single input delayed a number of times (e.g. X[n], X[n−1], X[n−2], etc.), the present value of multiple inputs (e.g. X1[n], X2[n], X3[n], etc.), or some combination thereof.

Figure 1B:
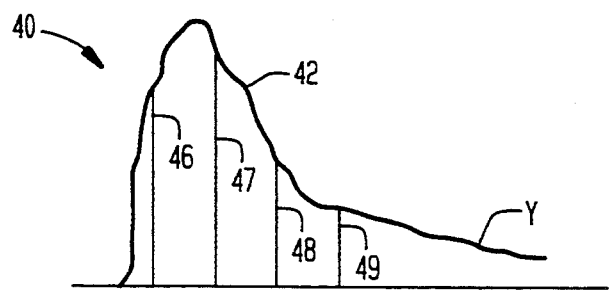
FIG. 1B is a graph illustrating a relationship between an analog filter impulse response and a response of the adaptive digital filter shown in FIG. 1A.

Referring to FIG. 1B, a graph 40 illustrates the impulse response of the adaptive filter 20. The graph 40 has an analog plot 42 thereon indicative of a response of an analog filter to an impulse input (not shown). The plot 42 corresponds approximately to the Y signal. Four bars 46-49 are superimposed on the plot 42. The length of the bar 46 corresponds to the magnitude of the weight W1. Similarly, the lengths of the bars 47-49 correspond to the magnitudes of the weights W2, W3, and W4, respectively. The bars 46-49 illustrate that, by adjusting the weights W1, W2, W3, and W4, the response of the adaptive digital filter 20 to a digital impulse input can be made to approximate the impulse response of the analog filter shown by the plot 42. That is, the weights W1, W2, W3, and W4 can be set such that an impulse digital input to the adaptive digital filter 20 will produce an output, Y[n], that approximates the plot 42.

The adaptive digital filter 20 is so-named because the values of the weights W1, W2, W3, and W4 can change as a function of time, thereby adapting the filter 20 to a variety of conditions during operation. An adaptive digital filter weight adjustment unit 32, shown in FIG. 1A, adjusts the weights of the adaptive digital filter 20. For instance, the weights can be changed so that the adaptive filter 20 approximates the impulse response of a different analog filter than that shown by the plot 42 of FIG. 1B. Changing the weights as a function of time is useful for a variety of applications where the nature of the signal and/or the nature of the noise superimposed on the signal can vary with time, such as in the high frequency communication channel application described hereinafter and used to illustrate the present invention.

One technique for updating the weights of an adaptive digital filter is the "least-means squares" technique, wherein the weights of the filter are updated according the magnitude of the error of the filter output. The error of the filter output is the difference between the actual filter output and the desired filter output. The following equation illustrates the least-mean squares technique for calculating new values for the weights W1, W2, W3, and W4:

$$W[n+1] = W[n] + 2ue[n]X[n] \qquad (2)$$

The quantities W and X represent vectors where the vector W has components W1, W2, W3, etc. and the vector X has components X1, X2, X3, etc. Writing the above equation in vector notation is equivalent to writing the following separate equations:

$$W1[n+1] = W1[n] + 2ue[n]X1 \qquad (3)$$

$$W2[n+1] = W2[n] + 2ue[n]X2 \qquad (4)$$

$$W3[n+1] = W3[n] + 2ue[n]X3 \qquad (5)$$

$$W4[n+1] = W4[n] + 2ue[n]X4 \qquad (6)$$

If the values for the X vector are from the adaptive digital filter 20 of FIG. 1A, then X1=X[n], X2=X[n−1], X3=X[n−2], and X4=X[n−3]. However, as discussed above, in general it is possible for X1, X2, X3, etc. to represent the present value of separate input values.

The quantity e[n] in the above equations represents the present value of the error of the filter and is given by the following equation:

$$e[n] = d[n] - Y[n] \qquad (7)$$

where d[n] equals the present value of the desired output and Y[n] equals the present value of the actual output.

The quantity u in the above equations is the rate that the weights of the adaptive filter 20 are allowed to change. This quantity is deemed the "loop bandwidth" of the filter 20. The magnitude of u controls the operation of the weight adjustment unit 32 and hence controls the performance of the adaptive digital filter 20. As u becomes larger, the loop bandwidth increases, thus making the adaptive digital filter 20 more responsive to the magnitude of e[n]. As u decreases, the loop bandwidth decreases and the adaptive digital filter 20 is less responsive to the magnitude of e[n].

There is a trade-off between having a wide loop bandwidth (i.e. the weights are allowed to change at a relatively rapid rate) and a narrow loop bandwidth (i.e. the weights are allowed to change at a relatively slow rate). Having a wide loop bandwidth that allows the weights to change rapidly is useful when the nature of the signal changes rapidly and the filter 20 must adapt quickly to the new signal. However, the wide loop bandwidth is disadvantageous in instances where changes in the error signal are due to noise. The weights will be erroneously changed due to the noise. A narrow loop bandwidth, on the other hand, prevents the weights from being changed incorrectly due to spurious noise, but may unacceptably slow down desirable weight changes when signal changes occur.

Figure 2:
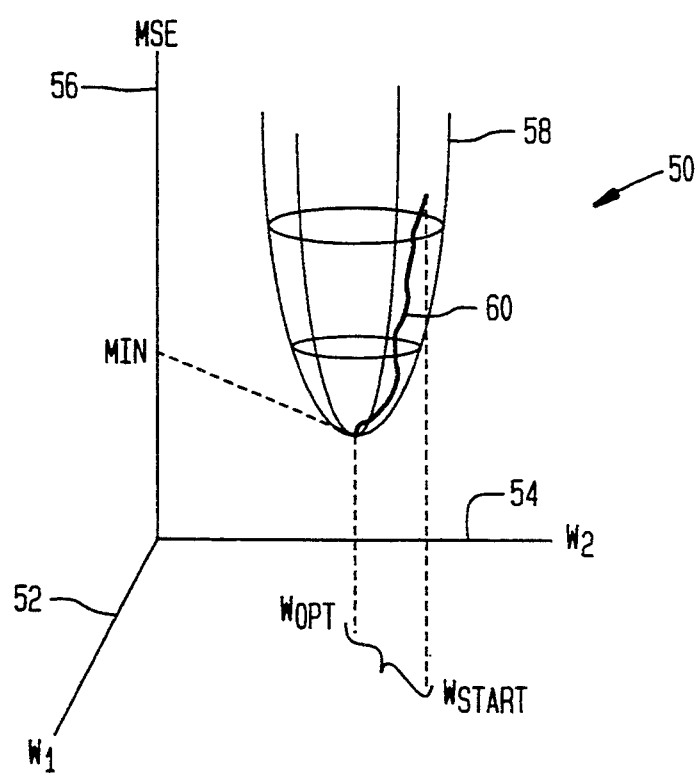
FIG. 2 is a graph illustrating the relationship between coefficients of a digital filter and the error 10 output of the digital filter.
Figure 3A:
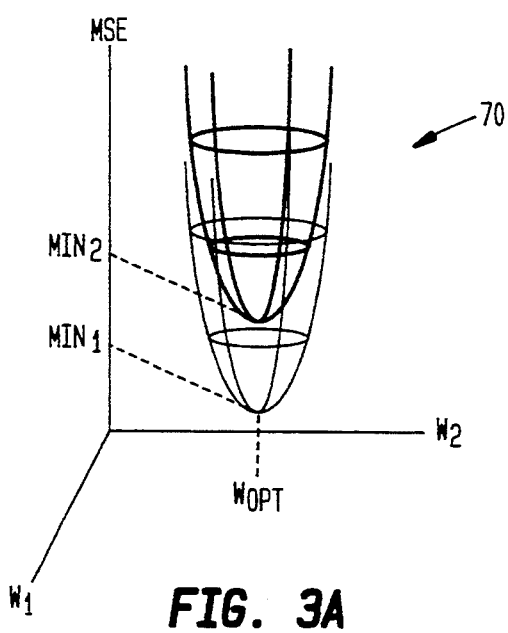
FIG. 3 is a plurality of graphs illustrating the relationship between coefficients of a digital filter and the error output of the digital filter.
Figure 3B:
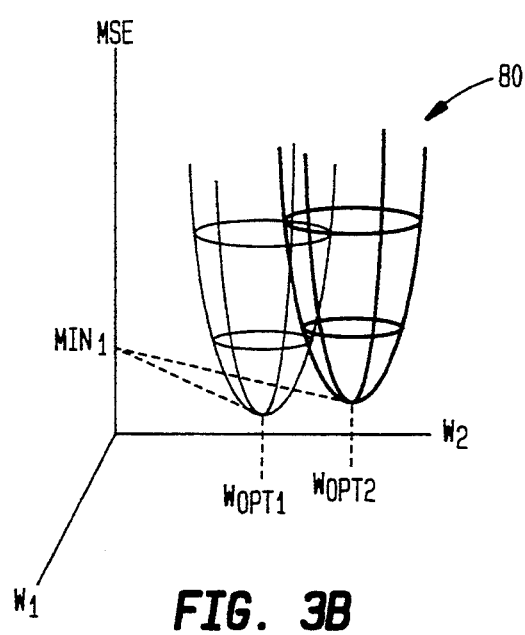
Figure 3C:
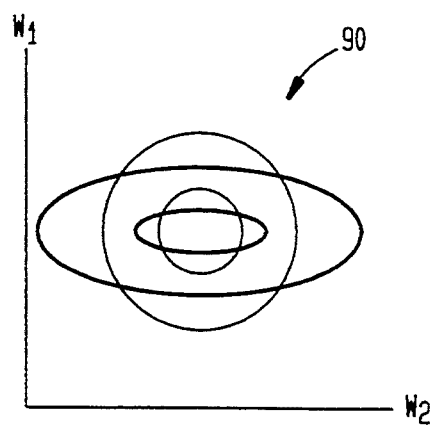
Figure 3D:
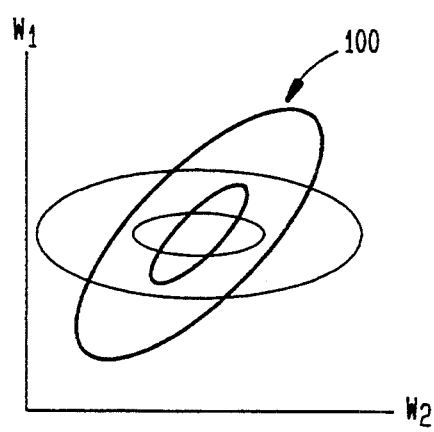

Referring to FIG. 2, a graph 50 illustrates adjustment of two weights W1 and W2 in response to the value of the mean-square error (MSE) of the output signal Y[n]. A first axis 52 of the graph 50 represents the magnitude of W1. A second axis 54 represents the magnitude of W2. A third axis 56 represents the magnitude of the MSE. A three dimensional surface 58 describes possible value combinations for W1, W2, and MSE. The optimal values for W1 and W2, indicated on the graph 50 as Wopt, corresponds to the lowest part of the three dimensional surface 58, i.e. the part of the surface 58 corresponding to the smallest value for the MSE.

A line 60 drawn on the surface 58 shows the transition of the weights W1, W2 from Wstart, which indicates the starting weights, to Wopt, which indicates the optimal weights. For each sample iteration, W1 and W2 are adjusted according to Eq. (2), above. The rate at which W1 and W2 converge on Wopt is determined by the loop bandwidth, the magnitude of u. That is, the number of iterations required for the weights to change from Wstart to Wopt is determined by the loop bandwidth of the adaptive digital filter represented by the surface 58. The direction and steepness of a vector drawn tangential to the surface 58 at a point is deemed the gradient of the surface 58 at that point. The steeper the gradient at a particular point, the more quickly W1 and W2 will converge to Wopt.

There are two phenomena which would cause W1 and W2 to change after the Wopt operating point is reached. The first is spurious noise in the system. The second is a change in the surface 58, i.e. a change in the signal being filtered. If u is kept relatively small (i.e. a narrow loop bandwidth), then the effect of the noise will be kept to a minimum. For each iteration, the values of W1 and W2 will change very slightly and any noise in the system will not greatly effect W1 and W2. Furthermore, on average, the noise signals will tend to cancel each other. Since a narrow loop bandwidth makes W1 and W2 change slowly, the effects of the noise on W1 and W2 will be minimal.

However, a small u will inhibit the system's ability to react quickly to a change in the nature of the signal. If the signal is such that the Wopt point changes rapidly, it is desirable to have a relatively wide loop bandwidth, i.e. a large u, in order to allow the weight adjustment unit 32 of the adaptive digital filter 20 to adapt sufficiently to the new signal. Systems wherein Wopt changes as a function of time are deemed "non-stationary" systems.

Referring to FIG. 3, a plurality of graphs 70, 80, 90, 100 illustrate different ways that the signal being filtered can change for non-stationary systems. In the graph 70, the surface that describes W1, W2, and MSE is shown translating in a vertical direction from one position to another. In this case the value of Wopt does not change, but the MSE associated therewith does. In the graph 80, the surface that describes W1, W2, and MSE changes from one position to another, thereby causing Wopt to change from Wopt1 to Wopt2. The number of iterations that are required to adjust W1 and W2 to the new value of Wopt is a function of the loop bandwidth of the filter. As the loop bandwidth increases, the number of iterations decreases.

The graphs 90, 100 show a top view of surfaces describing W1, W2, and MSE. For the graphs 90, 100, the MSE is the vertical axis coming out of the page. The darker lines of the graphs 90, 100 indicate the contour of a first surface and the lighter lines of the graphs 90, 100 indicate the contour of a second surface. The graphs 90, 100 show that the surfaces describing W1, W2, and MSE can change shape and be non-symmetrical about an axis corresponding to the value of the MSE. The graph 90 shows that the surface, from the top view, can change shape from a circle to an oval. Similarly, the graph 100 illustrates that the surface can change from an oval having an axis with a first orientation to an oval having an axis with a second orientation. Note that the graphs 70, 80, 90, 100 only show a small subset of the number of possible signal changes for a non-stationary system.

Figure 4:
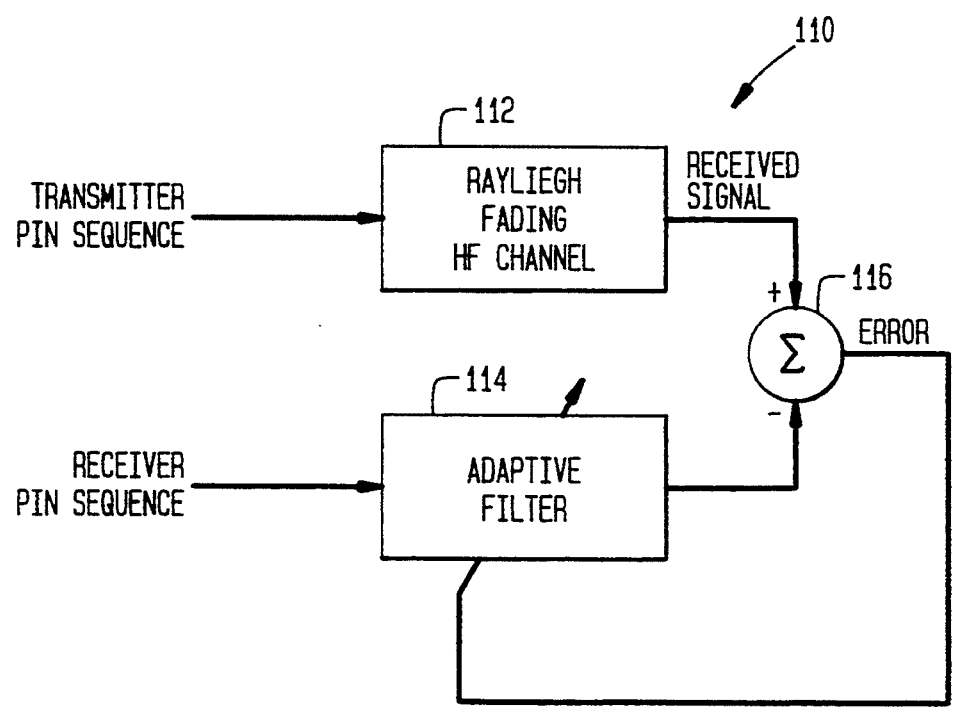
FIG. 4 is a schematic block diagram illustrating a high frequency communication channel using an adaptive digital filter according to an exemplary embodiment of the invention.

Referring to FIG. 4, a schematic block diagram 110 illustrates a high frequency communication channel 112 that is modeled using an adaptive digital filter 114. At one end of the channel 112 a transmitter (not shown) transmits a signal. At the other end of the channel 112, a receiver (not shown) receives the signal. The difference between the transmitted signal and the received signal is distortion introduced by the channel 112. The adaptive digital filter 114 is provided to counteract the distortion introduced by the channel 112 by filtering the received signal. The difference between the received signal and the filtered signal is determined at a summing junction 116, which outputs an error signal that is fed back to the adaptive filter 114. The adaptive filter 114 attempts to drive the error signal to zero.

The high frequency communication channel 112 represents high frequency radio communication passing through the Earth's upper atmosphere. The channel 112 is labeled "Raleigh Fading" to denote the specific characteristics of this type of communication. Raleigh Fading refers to a relatively slow time-variant change in the transmission characteristics of the channel 112. Generally, the change of the characteristics of a Raleigh fading channel is similar to transition in signal characteristics illustrated by the graph 80 of FIG. 3.

The adaptive digital filter 114 is provided at the receiving end of the channel 112 to model the characteristics of the Raleigh Fading channel 112. Any received communication signals can thereby be filtered at the receiver to remove distortion introduced by the channel 112. The adaptive digital filter 114 adapts at periodic intervals when a PN sequence, having known signal characteristics, is transmitted over the channel 112. The error is calculated by taking the difference between the received PN sequence and an idealized PN sequence filtered through the adaptive filter 114.

The adaptive digital filter 114 is similar to the adaptive digital filter 20 shown in FIG. 1A. The output of the adaptive filter 114 equals the input multiplied by a first weight plus the input delayed one sample period multiplied by a second weight plus the input delayed two sample periods multiplied by a third weight and so on. During the adaptation phase (when the PN sequence is transmitted), the weights are adjusted by an adaptive digital filter weight adjuster using equation (2), above. The error is determined by comparing an idealized version of the PN sequence with the received PN sequence filtered through the filter 114. The value of u, which also varies with time, determines the rate at which the weights are allowed to change in response to the magnitude of the error signal.

Figure 5A:
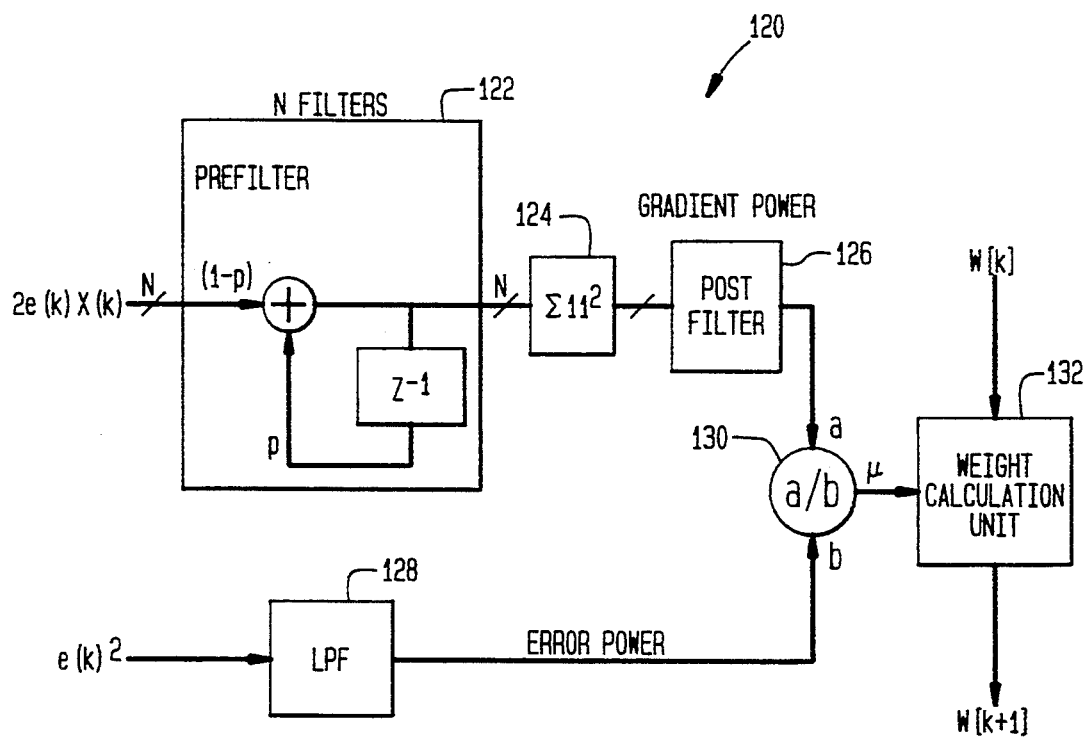
FIG. 5A is a schematic block diagram of apparatus according to an exemplary embodiment of the invention for adjusting the weights of an adaptive digital filter.

Referring to FIG. 5A an exemplary embodiment of an adaptive digital filter weight adjuster unit 120 for the adaptive digital filter 114 is shown. The weight adjuster unit 120 is provided with an input signal indicative of the present value of the error signal, e[k], and the present value of the received signal, x[k]. These signals are processed each iteration to provide a new value of u, the loop bandwidth. The value of u and the value of w[k] are then used to determine the value of a new weight, w[k+1].

As shown in FIG. 5A the quantity 2*e[k]*x[k] is provided to a prefilter 122. For this embodiment, the prefilter 122 is shown as a single pole IIR digital low-pass filter, although it will be understood by one of ordinary skill in the art that other types of digital low-pass filters could be used instead. The filter constant, p, determines the bandwidth of the low-pass filter 122. The filter 122 is such that the bandwidth is narrow enough to filter out spurious noise and wide enough to detect non-stationary behavior. The exact value for p depends upon the nature of the signal being monitored, the noise which distorts the signal, and a variety of functional factors which can be determined by one of ordinary skill in the art in light of discussion contained herein.

Figure 5B:
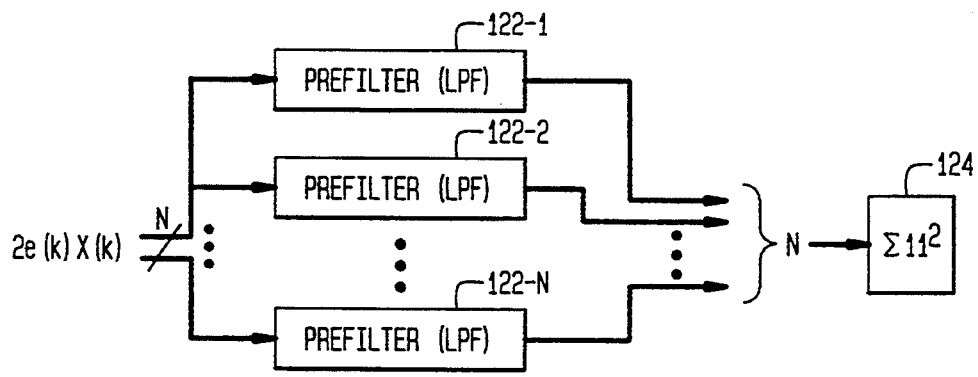
FIG. 5B diagrammatically illustrates a plurality of prefilters 122-1 . . . 122-1N for the lowpass prefilter 122 of FIG. 5A.

The quantity x[k], which is part of the input to the filter 122, is a vector quantity that indicates separate input values corresponding to x[k], x[k−1], x[k−2], etc. Therefore, as diagrammatically illustrated in FIG. 5B, the filter 122 represents a plurality of separate filters, 122-1 . . . 122N wherein one filter filters x[k], another filter filters x[k−1], etc. Of course, as discussed above, the input could be in the form of X1[k], X2[k], X3[k], wherein each represents a present value of an input signal from separate sources. However, for the adaptive filter illustrated herein, there is only a single input source and the vector x[k] represents a single digital signal.

The multiple outputs of the filter 122 are combined at a squaring unit 124, which provides the sum of the squares of each of the separate outputs of the filter 122. The D.C. component of the output of the squaring unit 124 is the power of the signal gradient. The output of the squaring unit 124 is provided to a low-pass filter 126, which can be a single-pole IIR filter similar to the low-pass filter 122. Of course, it will be understood by one of ordinary skill in the art that other types of filters could be used instead. The filter 126 attempts to extract the D.C. component of the signal and hence has a fairly narrow bandwidth. However, the bandwidth is wide enough so as to make the delay of the filter 126 not be excessive. The output of the filter 126 is a signal indicative of the signal gradient power.

The present value of the error signal, e[k], is squared and provided to a low-pass filter 128, which is similar to the filter 126. The magnitude of the D.C. component of the squared error signal is indicative of the signal error power. The bandwidth of the filter 128 is made relatively narrow in order to provide the D.C. component of the input signal as an output. However, just as with the low-pass filter 126, the bandwidth of the filter 128 is not so narrow as to create an unacceptable delay.

The output of the filter 128, the error power, is provided to a division unit 130, which is also provided with the output of the filter 126, the gradient power. The division unit 130 divides the gradient power by the error power and outputs u, the loop bandwidth. The loop bandwidth of the system is proportional to the ratio of the gradient signal power to the error power. The value of u is provided to a weight calculation unit 132, which calculates a new value for the weight for the adaptive digital filter 114 using u and using the previous value of the weight.

Figure 6A:
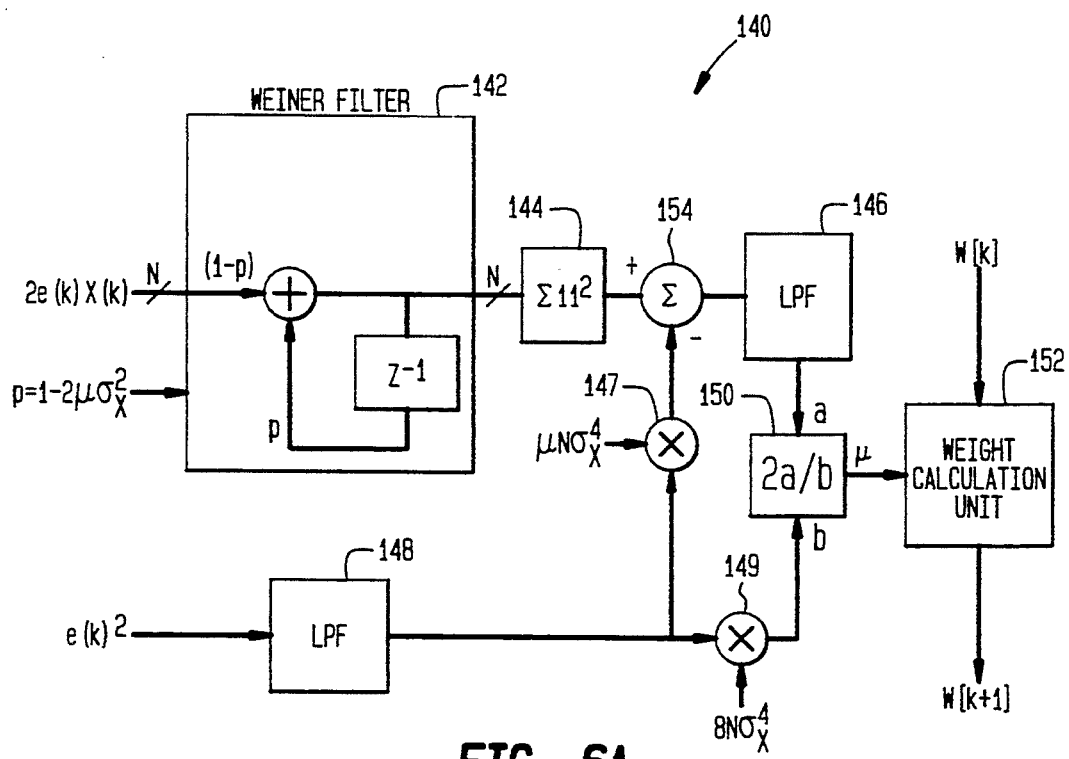
FIG. 6A is a schematic block diagram of apparatus according to another exemplary embodiment of the invention for adjusting the weights of an adaptive digital filter.
Figure 6B:
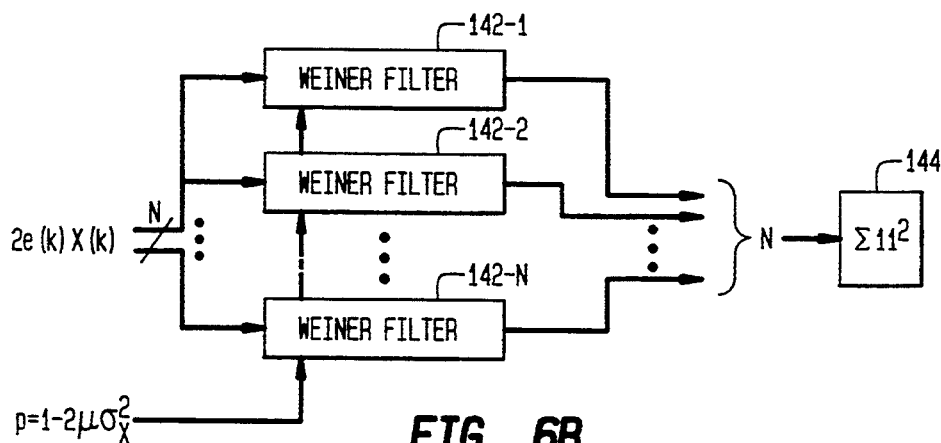
FIG. 6B diagrammatically illustrates a plurality of prefilters 142-1 . . . 142-N for the lowpass Weiner prefilter 142 of FIG. 6A.

Referring to FIG. 6A, an alternative embodiment of a weight adjuster unit 140 is shown. A low-pass filter 142 is similar to the low-pass filter 122 of FIG. 5A. Namely, as diagrammatically illustrated in FIG. 6B, low-pass Weiner filter 142 may comprise a plurality N of prefilters 142-1 ... 142-N. The filter 142, however, is a Weiner filter, which is a known type of digital low-pass filter that provides an optimum signal to noise ratio at the output. The filter constant, p, varies with time and equals $1 - 2u\sigma_x^2$, as shown in FIG. 6A at an input to the filter 142. The symbol $\sigma_x^2$ represents the magnitude of the power of the input signal, x, squared and then averaged. This is determined by squaring the magnitude of x[k] and then providing the result to a conventional digital low-pass filter (not shown), such as a single-pole IIR filter. The low-pass filter averages the values of x[k] squared.

The output of the Weiner filter 142 is provided to a squarer 144, which operates in a manner similar to the squarer 124 of FIG. 5A. The low-pass filter 146 is provided with the output of the squarer 144 and with the present value of the error signal, e[k], squared, respectively. The outputs of the low-pass filters 146, 148 are provided to a dividing unit 150, which divides the gradient signal power by the error power to provide the loop bandwidth, u. The value of u is then provided to a weight calculation unit 152, which calculates a new value for the weight for the adaptive digital filter 114 using u and using the previous value of the weight. Operation of the low-pass filters 146, 148, the dividing unit 150, and the weight calculation unit 152 is similar to that illustrated for the low-pass filters 126, 128, the dividing unit 130, and the weight calculation unit 132 of FIG. 5A.

The weight adjusting unit 140 of FIG. 6A contains additional elements not found in the weight adjusting unit 120 of FIG. 5A. A summation unit 154, interposed between the squarer 144 and the low-pass filter 146, subtracts a quantity from the magnitude of the output of the squarer 144 and provides the result to the low-pass filter 146. The magnitude of this quantity provided to the summation unit 154 equals the magnitude of the low-pass filter 148 multiplied via a multiplier 147 by $uN\sigma_x^4$ where N is the number of taps of the adaptive digital filter (i.e. the number of x values) and $\sigma_x^4$ is the square of the quantity $\sigma_x^2$, described above. The quantity that is subtracted at the summation unit 154 represents an estimate of the spurious noise of the system. Similarly, FIG. 6A also indicates that the magnitude of the output of the low-pass filter 148 is multiplied via a multiplier 149 by $8N\sigma_x^4$ prior to being provided to the dividing unit 150.

Returning to FIG. 5A, it is possible to use the weight adjusting unit 120 shown therein to calculate separate loop bandwidths for each weight. That is, instead of calculating a single loop bandwidth for each of the weights of the adaptive digital filter 114, a loop bandwidth for each of the weights can be separately calculated. Note that, as discussed above, the filter 122 actually represents a plurality of separate filters having separate inputs represented as x[k] in FIG. 5A. Therefore, the inputs can be processed separately. Instead of summing the squared outputs of the separate filters 122 at the squarer unit 124, the outputs for each of the filters 122 are squared at the squarer 124 but then provided individually to the filter 126. For each weight, therefor, a different value of u is provided by the divider 150. Providing a different value of u for each weight is useful in situations where the surface describing the weights and the MSE is non-symmetrical about an axis corresponding to the value of the MSE, such as the surfaces shown in the graphs 90, 100 of FIG. 3.

It will be understood by one skilled in the art that elements of the weight adjuster units 120, 140 and the adaptive digital filters 20, 114 can be implemented using hardware, software, or a combination thereof. For example, each of the elements 122, 124, 126, 128, 130, 132 of the weight adjuster unit 120 can represent specific digital hardware, obvious to one of ordinary skill in the art, such as digital hardware implemented low-pass filters 122, 126, 128, a digital hardware implemented dividing unit 130, etc. Construction of the appropriate apparatus, based on the description provided herein, would be obvious to one of ordinary skill in the art. Alternatively, each of the elements 122, 124, 126, 128, 130, 132 can represent a software module, the implementation of which would be obvious to one of ordinary skill in the art in view of the description provided herein. Although the invention is illustrated herein as being using to filter a Raleigh Fading communication channel, it will be appreciated by one of ordinary skill in the art that the invention can be employed in a variety of other applications.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. An apparatus for adjusting weights of an adaptive digital filter having outputs comprising:
   a first low-pass filter, for low-pass filtering a signal indicative of a product of an error signal representative of a difference between actual and desired outputs of said adaptive digital filter and one or more input signals;
   a squarer, for squaring an output of said first low-pass filter;
   a second low-pass filter, for low-pass filtering an output of said squarer, so as to extract a D.C. component thereof;
   a third low-pass filter, for low-pass filtering a signal indicative of a squared version of said error signal, so as to extract a D.C. component thereof;
   a dividing unit, for dividing an output of said second low-pass filter by an output of said third low-pass filter, so as to provide a loop bandwidth signal; and
   a weight calculation unit, for providing values for one or more weights of said adaptive digital filter according to previous values of said weights and a value of said loop bandwidth signal provided by said dividing unit.

2. An apparatus according to claim 1, wherein said first, second, and third low-pass filters are single-pole IIR low-pass filters.

3. An apparatus according to claim 2, wherein said first low-pass filter has plural inputs and plural outputs, and wherein said squarer provides a sum of squares of said plural outputs of said first low-pass filter.

4. An apparatus according to claim 1, wherein said first low-pass filter has plural inputs and plural outputs, and wherein a respectively different value of loop bandwidth signal is provided for each weight.

5. An apparatus according to claim 1, wherein said first low-pass filter comprises a Weiner low-pass filter having a bandwidth that varies according to a power of said one or more input signals applied thereto.

6. An apparatus according to claim 5, wherein a quantity representative of spurious noise is subtracted from an input of said second low-pass filter.

7. An apparatus according to claim 1, wherein said one or more input signals correspond to one or more signals that have been received from a high frequency communication channel that is subject to Raleigh fading, and wherein said adaptive digital filter is operative to filter said one or more received signals to compensate for distortion introduced by said high frequency communication channel.

8. A method for adjusting weights of an adaptive digital filter comprising the steps of:
   (a) low-pass filtering a signal indicative of a product of an error signal representative of a difference between actual and desired outputs of said adaptive digital filter and one or more input signals;
   (b) squaring said signal that has been low-passed filtered in step (a);
   (c) low-pass filtering the squared signal obtained in step (b) so as to extract a D.C. component thereof and provide a gradient power signal;
   (d) low-pass filtering a signal indicative of a squared version of said error signal, so as to extract a D.C. component thereof and a gradient noise power signal;
   (e) dividing a magnitude of said gradient power signal provided in step (c) by a magnitude of said gradient noise power signal provided in step (d), to provide a loop bandwidth signal; and
   (f) providing values for one or more weights of said adaptive digital filter according to previous values of said weights and a value of said loop bandwidth signal provided in step (e).

9. A method according to claim 8, wherein said low-pass filtering steps (a), (c) and (d) employ single-pole IIR low-pass filters.

10. A method according to claim 9, wherein step (a) comprises low-pass filtering plural inputs and providing plural low-pass filtered outputs, and wherein step (b) comprises providing a sum of squares of said plural low-pass filtered outputs of step (a).

11. A method according to claim 8, wherein step (a) comprises low-pass filtering plural inputs and providing plural low-pass filtered outputs, and wherein a respectively different value of loop bandwidth signal is provided for each weight.

12. A method according to claim 8, wherein step (a) comprises filtering plural inputs by means of a Weiner low-pass filter having a bandwidth that varies according to a power of said one or more input signals applied thereto.

13. A method apparatus according to claim 12, wherein a quantity representative of spurious noise is subtracted from an input of step (c).

14. A method according to claim 8, wherein said one or more input signals correspond to one or more signals that have been received from a high frequency communication channel that is subject to Raleigh fading, and wherein said adaptive digital filter filters said one or more received signals to compensate for distortion introduced by said high frequency communication channel.

* * * * *